United States Patent [19]

Fuchs et al.

[11] Patent Number: 5,298,760
[45] Date of Patent: Mar. 29, 1994

[54] PERFORMANCE OF LOCATION-SELECTIVE CATALYTIC REACTIONS WITH OR ON THE SURFACES OF SOLIDS IN THE NANOMETER OR SUBNANOMETER RANGE

[75] Inventors: Harald Fuchs, Carlsberg; Thomas Schimmel, Hof, both of Fed. Rep. of Germany

[73] Assignee: BASF Aktiengesellschaft, Ludwigshafen, Fed. Rep. of Germany

[21] Appl. No.: 924,496

[22] Filed: Aug. 4, 1992

[30] Foreign Application Priority Data

Aug. 9, 1991 [DE] Fed. Rep. of Germany ....... 4126380

[51] Int. Cl.$^5$ .............................................. G11B 9/00
[52] U.S. Cl. .............................. 250/492.3; 250/492.2; 369/126
[58] Field of Search ........................ 250/492.3, 492.2; 369/126

[56] References Cited

FOREIGN PATENT DOCUMENTS 0427443 5/1991 European Pat. Off. .

OTHER PUBLICATIONS

Ehrichs et al., "Direct writing with the scanning tunneling microscope", J. Vac Sci. Tech., A 6(2), Mar./Apr. 1988, pp. 540–543.
Bernhardt, et al., "Mechanisms for the deposition of nanometer . . . ", J. Vac. Sci. Tech., A 8(1), Jan./Feb. 1990, pp. 667–671.
IBM Technical Disclosure Bulletin, vol. 29, No. 6, Nov. 1986, "Direct pattern writing by local heating in a scanning tunneling microscope".
Reactive graphite etch and the structure of an adsorbed organic monolayer—a scanning tunneling microscopy study, Rabe et al. J. Vac. Sci. Technol. A8(1) Jan./Feb. 1990.

Primary Examiner—Jack I. Berman
Attorney, Agent, or Firm—Keil & Weinkauf

[57] ABSTRACT

In a process for the performance of location-selective catalytic reactions with or on the surfaces of solids in the nanometer or subnanometer range, the surface in question is chemically modified by means of a surface-sensitive scanning probe containing the catalytic material. This process is used for information storage.

13 Claims, 3 Drawing Sheets

PERFORMANCE OF LOCATION-SELECTIVE CATALYTIC REACTIONS WITH OR ON THE SURFACES OF SOLIDS IN THE NANOMETER OR SUBNANOMETER RANGE

The present invention relates to a process for performing location-selective catalytic reactions with or on the surfaces of solids in the nanometer or subnanometer range, in which the surface in question is chemically modified locally, and to the use of this process for information storage.

The controlled, location-selective performance of catalytic reactions on surfaces on a very small length scale and at very precisely defined positions on the surface is of interest in a number of respects.

Firstly, defined chemical modification of the surfaces of solids at very high local resolution has become a key technology, especially in the production of components in the semiconductor industry, and is the crucial factor in potential further miniaturization of the components and the limits thereof. Here, the local resolution in conventional lithographic processes is principally limited by the wavelength of the radiation used. On the other hand, experiments with scanning tunneling microscopes show that it is possible to modify materials in a defined manner on a nanometer or even atomic scale. Surface-sensitive scanning probes thus provide a technique here which allows a local resolution which was hitherto impossible to achieve using conventional methods of semiconductor production.

Secondly, the technique of controlled chemical modification of surfaces on a scale from a few nanometers down to atomic dimensions can also be used for information storage, for example by dividing the surface into nanometer-sized grid squares and giving an unmodified grid square the value 0 and a chemically modified grid square the value 1. If, in addition, the chemical reaction is reversible, the information stored in this way can also be erased again.

However, the prerequisite for the use of such techniques is the provision of a process which allows a local chemical modification of this type, for example using a surface-sensitive scanning probe. Experiments disclosed hitherto are mostly based on reactive electrochemical etching of the surface, for example of graphite (see J.P. Rabe, S. Buchholz and A.M. Ritcey, J. Vac. Sci. Technol. A, 8 (1990) 679). In such processes, however, the surface is destroyed irreversibly, which, inter alia, excludes erasability in the above sense. This major disadvantage can be avoided if the structure of the atomic or molecular surface lattice is left intact and if, for example, only foreign atoms are chemically bonded to the surface. Such "labels" can then be removed again by supply of energy, for example in the form of thermal energy. One way of carrying out local chemical surface reactions of this type and of other types in practice is to use a catalyst. However, it is essential, in order to avoid relatively large areas of the surface reacting catalytically, that the catalyst is only effective locally.

It is an object of the present invention to provide a process which allows the specific and location-selective performance of catalytic chemical reactions with or on a surface at high local resolution down to the nanometer range or down to the atomic range.

We have found that this object can be achieved if the catalyst used is a surface-sensitive scanning probe which contains the catalytic material and is located, during the reaction, directly above the part of the surface with which or on which the chemical reaction takes place.

The surface-sensitive probe used can be the tip of a scanning tunneling microscope (STM) or the tip of the lever of a scanning atomic force microscope (SAFM), in particular made from or coated with a catalytically active material. Examples of appropriate materials are platinun/iridium, cobalt, nickel and/or iron.

Suitable surfaces of solids are semiconducting layered materials, in particular tungsten diselenide. Surfaces of solids having an adsorbate layer located thereon or a liquid-crystalline phase can also be employed in the same way.

The process according to the invention can advantageously be designed so that the local chemical reaction of the surface takes place due to supply of a gas as reactant, the gas being blown onto the surface after the catalytically active surface-sensitive scanning probe has been positioned directly at the point at which the reaction of the gas on or with the surface is to take place, the catalytically induced reaction of the gas with the surface only taking place in the immediate vicinity of the catalytically active probe and the excess gas in each case being removed when the local reaction is complete. This procedure can be repeated at another point of the surface, after the probe has been re-positioned, by re-admitting gas. A procedure of this type allows even atomic positions in the surface of a solid to be labeled by location-selective catalytic chemical reaction of a gas atom or gas molecule with the atoms of the solid present at these positions.

A further expedient embodiment of the process according to the invention comprises the reaction gas having already been adsorbed or chemisorbed onto the surface of the solid or onto the catalytically active probe before the location-selective catalytic reaction.

In the same way, the process according to the invention for the performance of location-selective catalytic reactions is also suitable for the case where a reaction is to be initiated between the surface of the solid and a liquid, a liquid film or a thin adsorbate layer.

Since the catalytically active probe moves over the surface at a very short distance, in the order of atomic diameters, during the imaging process, ie. while the surface of the solid is imaged by means of the surface-sensitive scanning probe at a resolution in the nanometer range or atomic range, it is necessary, during imaging of the surface, to select a parameter necessary for the progress of the reaction, such as temperature, distance, catalyst surface, incidence of light, electrical field or the presence of a certain reactant, in such a manner that the reaction does not proceed as early as during the imaging process at all points where the probe comes into contact with the sample, if it is desired to avoid an imaging process of this type.

The point to be modified chemically or the point at which the catalytic reaction is to take place is subsequently selected on the sample surface, and the probe is positioned at this point and moved to a sufficiently short distance from the surface. When positioning of the probe is complete, care is taken to ensure that all reaction parameters are set at the values necessary for the reaction to proceed. The parameters are set so that the reaction only takes place to a significant extent at the point of probe/surface contact. In general, all reaction parameters apart from one are kept at these values even during this imaging process, while this one parameter, the initiation parameter, is only set to a value necessary for the local chemical reaction to proceed once the probe has been positioned. Appropriate initiation parameters are temperature, concentration of the reaction gas and an electrical, magnetic or electromagnetic field. If the reaction only takes place at a significant rate at elevated temperature, the temperature is, in the process according to the invention, generated locally at the desired location of the chemical reaction by briefly applying a sufficiently high electrical current between the surface-sensitive scanning probe and the sample, for example by means of a tunneling current or a current due to point contact. The catalytic reaction of the surface at the location of the surface-sensitive scanning probe can also be initiated by a transient electrical field, the latter being generated by applying an electrical voltage pulse between the catalytically active scanning probe and the surface. In a further advantageous embodiment of the process according to the invention, the catalytic reaction of the surface at the location of the surface-sensitive scanning probe is initiated by irradiation with electromagnetic radiation, for example a laser beam, microwaves, infra-red radiation, light or ultraviolet radiation, it being possible thereby to carry out the reaction so location-selectively that it only takes place in the immediate vicinity of the catalytically active probe.

It is generally true that the process according to the invention can also be carried out by means of a combination of said initiation parameters, for example by simultaneous voltage pulses and local heating in the presence of the catalytically active probe and of a reactive gas.

This notwithstanding, it should be noted that the process according to the invention is also suitable for initiation of location-selective catalytic reactions in which the chemical surface reaction of the surface of the solid takes place without the participation or presence of a further reactant.

The process according to the invention has the advantage that the surface can be imaged at a local resolution in the nanometer or subnanometer range, before and after the modification, using the same probe which induces the chemical surface modification. This high-resolution imaging is necessary for process control, but can also be employed in a particularly advantageous manner for the storage of information units. A method is thus indicated of storing information in the atomic range and thus achieving the correspondingly high information density.

However, the storage of information units carried out with the aid of the novel process for location-selective catalytic reaction with or on the surface of a solid can also be erased again. This is accomplished by supplying energy, for example in the form of thermal energy or electromagnetic radiation (for example over the entire surface or at points by laser treatment), or alternatively by treating the surface chemically. In this way, the original state can be restored since the lattice is not destroyed, even locally, during the labeling process.

Figure 1:
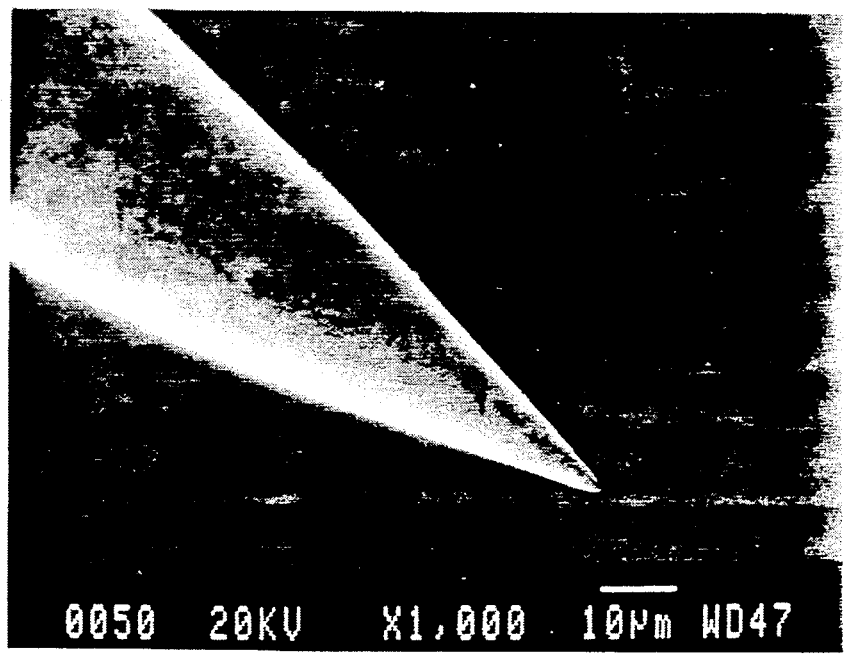
FIG. 1 shows a scanning electron photomicrograph of the STM tip immediately adjacent to the sample surface.

The process according to the invention is described in illustrative terms below:

The surface-sensitive scanning probe used was a scanning tunneling microscope tip comprising Pt-Ir as the catalytically active material and produced by mechanical cutting from Pt-Ir wire. The tip was moved toward the tungsten diselenide surface to be modified, a layered semiconductor, to a distance in the Ångstrom range. FIG. 1 shows a scanning electron photomicrograph of the STM tip immediately adjacent to the sample surface.

Figure 2:
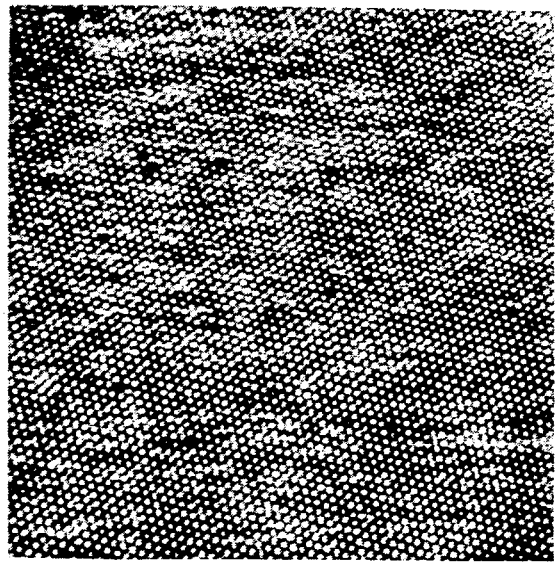
FIG. 2 shows the surface at atomic resolution before the surface modification.

Before the surface modification, the surface was imaged at atomic resolution (see FIG. 2; the pale points are the atoms, and the interatomic distance is 0.33 nm). The imaging operation was carried out at a tunneling voltage of 0.8 V, with the tip as the positive pole. The tunneling current was 3 nA. The imaging operation itself did not cause any modification to the surface, even after the same area of the sample surface was imaged without interruption for several hours. This applies not only to investigations under reduced pressure ($10^{-7}$ mbar), but also to imaging in air.

Figure 3:
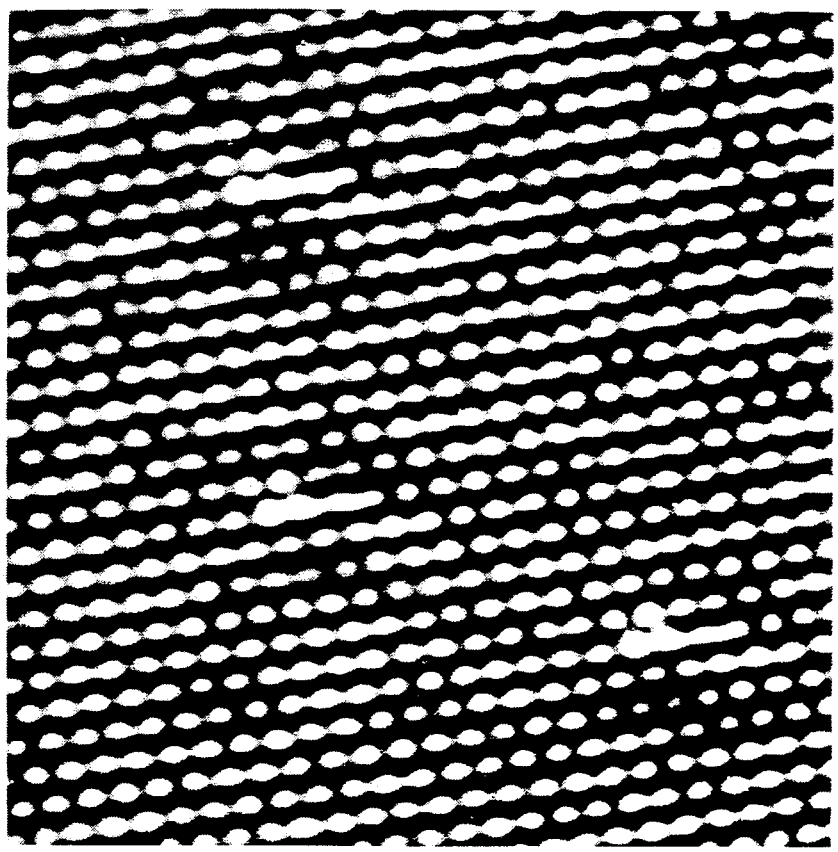
FIG. 3 shows the surface at atomic resolution after the surface modification.

The surface modification was carried out in air under atmospheric pressure. In order to initiate the chemical reaction of the surface at the location of the Pt/Ir tip, an electrical voltage pulse of amplitude 0.9 V and duration 10 ms (tip positive) was then added to the existing tunneling voltage. The brief increase in the tunneling current this caused also resulted in brief local warming of the tip and of the sample surface in a very small area around the tip. The pulse selectively initiates the desired local surface modification at the location at which the tip is positioned, as shown by the STM imaging subsequently carried out using the same tip (FIG. 3). Each of the pale points represents a surface modification written at the appropriate point by means of a single pulse. The structures in FIG. 3 have a diameter of about 1 nm.

Atomic-resolution images of the surfaces modified in this way show that the atomic order of the surface remains unchanged, even locally at the location of the modification, after the pulses, and the modification is evident from a change in the effective height, as is typical for a local modification of the electronic state density. By contrast, the atomic lattice is not destroyed by the process.

It was easily possible to carry out and subsequently to image more than 100 such modifications without the imaging quality of the tip or its effectiveness in the writing operation dropping noticeably. It was also apparent that, in spite of several hundred imaging operations (reading operations when used as an information store), there was no change in the modified areas. The modifications also proved to be time-stable in air for the experimental observation duration of two days.

We claim:

1. A process for the specific and location-selective performance of catalytic chemical reactions with or on the surface of a solid in the nanometer or subnanometer range, which consists essentially of locating as catalyst, a surface sensitive scanning probe which contains the catalytic material, during the reaction, directly above the part of the surface with which or on which the chemical reaction takes place.

2. A process as claimed in claim 1, wherein the catalytically active surface-sensitive probe employed is the tip of a scanning tunneling microscope (STM) or the tip of the lever of a scanning atomic force microscope (SAFM).

3. A process as claimed in claim 1, wherein the probe is made from or coated with the catalytically active material.

4. A process as claimed in claim 1, wherein, before the specific, location-selective surface reaction is carried out, the surface is imaged by means of the surface-sensitive scanning probe at a resolution in the nanometer range or in the atomic range, and the tip is positioned at a predefined atomic location within the image area precisely at selected points on the surface in the nanometer or subnanometer range.

5. A process as claimed in claim 1, wherein the local chemical reaction of the surface is carried out by supplying a gas as reactant, the gas being blown onto the surface after the catalytically active surface-sensitive scanning probe has been positioned directly at the point at which the reaction of the gas with the surface is to take place, the catalytically induced reaction of the gas with the surface only occurring in the immediate vicinity of the catalytically active probe, and the excess gas being removed in each case when the local reaction is complete.

6. A process as claimed in claim 1, wherein the reaction only takes place at a significant reaction rate at elevated temperature, and the elevated temperature is brought about locally at the desired location of the chemical reaction by briefly applying an electrical current of sufficient magnitude between the surface-sensitive scanning probe and the sample.

7. A process as claimed in claim 1, wherein the catalytic reaction of the surface at the location of the surface-sensitive scanning probe is initiated by a transient electrical field.

8. A process as claimed in claim 7, wherein the transient electrical field is generated using an electrical voltage pulse between the catalytically active scanning probe and the surface.

9. A process as claimed in claim 1, wherein the catalytic reaction of the surface at the location of the surface-sensitive scanning probe is initiated by irradiation with electromagnetic radiation.

10. A process as claimed in claim 1, wherein the chemical surface reaction of the surface of the solid takes place without the participation or presence of a further reactant.

11. A process as claimed in claim 1, wherein the surface of the solid is a semiconducting layered material.

12. A process as claimed in claim 1, wherein the surface of the solid is an adsorbate layer present on the surface or is a liquid-crystalline phase.

13. A process for erasing the marks obtained as claimed in claim 1 by supplying thermal energy, irradiation with electromagnetic radiation or chemical treatment of the surface.

* * * * *